US012757457B2

(12) United States Patent
Wang et al.

(10) Patent No.: US 12,757,457 B2
(45) Date of Patent: Oct. 6, 2026

(54) DIODE STRUCTURE FOR DIRECT BACKSIDE CONTACT, BACKSIDE POWER DELIVERY NETWORK

(71) Applicant: QUALCOMM Incorporated, San Diego, CA (US)

(72) Inventors: Hao Wang, San Diego, CA (US); Yan Sun, San Diego, CA (US); Shreesh Narasimha, Charlotte, NC (US)

(73) Assignee: QUALCOMM Incorporated, San Diego, CA (US)

(*) Notice: Subject to any disclaimer, the term of this patent is extended or adjusted under 35 U.S.C. 154(b) by 508 days.

(21) Appl. No.: 18/501,836

(22) Filed: Nov. 3, 2023

(65) Prior Publication Data

US 2025/0151346 A1 May 8, 2025

(51) Int. Cl.

| | |
|---|---|
| ***H10D 62/10*** | (2025.01) |
| ***H10D 8/01*** | (2025.01) |
| ***H10D 30/01*** | (2025.01) |
| ***H10D 30/43*** | (2025.01) |
| ***H10D 30/67*** | (2025.01) |
| ***H10D 89/60*** | (2025.01) |
| *H10D 30/62* | (2025.01) |

(52) U.S. Cl.

CPC ............. *H10D 62/121* (2025.01); *H10D 8/01* (2025.01); *H10D 30/014* (2025.01); *H10D 30/43* (2025.01); *H10D 30/6735* (2025.01); *H10D 30/6757* (2025.01); *H10D 89/611* (2025.01); *H10D 30/62* (2025.01); *H10D 30/6219* (2025.01)

(58) Field of Classification Search

CPC ....... H10D 62/121; H10D 8/01; H10D 30/014

See application file for complete search history.

(56) References Cited

U.S. PATENT DOCUMENTS 11,158,634 B1 10/2021 Huang et al.
2009/0045457 A1* 2/2009 Bobde .................... H10D 8/411 257/E29.066
2022/0271026 A1 8/2022 Hung et al.
(Continued)

OTHER PUBLICATIONS

International Search Report and Written Opinion—PCT/US2024/049459—ISA/EPO—Jan. 20, 2025.

*Primary Examiner* — Errol V Fernandes

(74) *Attorney, Agent, or Firm* — Seyfarth Shaw LLP/ Qualcomm

(57) ABSTRACT

A diode structure includes a nanosheet structure on a substrate, including a first, first-type diffusion region, a second, first-type diffusion region on the substrate, a first, second-type diffusion region, and a second, second-type diffusion region, each on the substrate. The diode structure includes a first gate on the nanosheet structure between the first and second, first-type diffusion regions. The diode structure includes a first frontside zero (M0) metal layer coupled to a frontside of the first and second, first-type diffusion regions, and a first backside M0 metal layer coupled to a backside of the first and second, first-type diffusion regions to form an anode. The diode structure includes a second frontside M0 metal layer coupled to a frontside of the first and second, second-type diffusion regions, and a second backside M0 metal layer coupled to a backside of the first and second, second-type diffusion regions to form a cathode.

20 Claims, 10 Drawing Sheets

(56) References Cited

U.S. PATENT DOCUMENTS

| | | | | |
|---|---|---|---|---|
| 2023/0093101 | A1 | 3/2023 | Xie et al. | |
| 2024/0006499 | A1* | 1/2024 | Huang ............... | H10D 84/0151 |
| 2024/0363617 | A1* | 10/2024 | Hook .................. | H10D 89/611 |

* cited by examiner

DIODE STRUCTURE FOR DIRECT BACKSIDE CONTACT, BACKSIDE POWER DELIVERY NETWORK

BACKGROUND

Field

Aspects of the present disclosure relate to semiconductor devices and, more particularly, to a diode structure for a direct backside contact, backside power delivery network (BSPDN).

Background

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down also increases the complexity of processing and manufacturing ICs. Moreover, realizing these advancements involves similar developments in IC processing and manufacturing.

Although existing methods of fabricating IC devices are adequate for their intended purposes, they are not entirely satisfactory in all respects. For example, fin-based devices are three-dimensional structures on the surface of a semiconductor substrate. A fin-based field effect transistor (FET) may be referred to as a FinFET. Advanced logic complementary metal oxide semiconductor (CMOS) scaling for FinFET technologies, such as gate all around (GAA) FETs achieves a performance-power-area (PPA) boost over past process nodes. Further FinFET transistor mobility in smaller process nodes, however, is difficult due to channel induced subthreshold leakage. One solution to channel induced subthreshold leakage is dielectric junction isolation. Unfortunately, dielectric junction isolation prevents utilization of a vertical P-N junction diode (without introducing extra masking steps). Therefore, an improved diode structure is desired.

SUMMARY

A diode structure includes a nanosheet structure on a substrate, including a first, first-type diffusion region, a second, first-type diffusion region on the substrate, a first, second-type diffusion region, and a second, second-type diffusion region, each on the substrate. The diode structure includes a first gate on the nanosheet structure between the first and second, first-type diffusion regions. The diode structure includes a first frontside zero (M0) metal layer coupled to a frontside of the first and second, first-type diffusion regions, and a first backside M0 metal layer coupled to a backside of the first and second, first-type diffusion regions to form an anode. The diode structure includes a second frontside M0 metal layer coupled to a frontside of the first and second, second-type diffusion regions, and a second backside M0 metal layer coupled to a backside of the first and second, second-type diffusion regions to form a cathode.

A method of forming a diode structure is described. The method includes forming a nanosheet structure on a substrate. The nanosheet structure includes a first, first-type diffusion region on the substrate, a second, first-type diffusion region on the substrate, a first, second-type diffusion region on the substrate, and a second, second-type diffusion region on the substrate. The method also includes forming a first gate on the nanosheet structure between the first and second, first-type diffusion regions. The method further includes forming a first frontside zero (M0) metal layer coupled to a frontside of the first and second, first-type diffusion regions, and a first backside M0 metal layer coupled to a backside of the first and second, first-type diffusion regions to form an anode. The method also includes forming a second frontside M0 metal layer coupled to a frontside of the first and second, second-type diffusion regions, and a second backside M0 metal layer coupled to a backside of the first and second, second-type diffusion regions to form a cathode.

This has outlined, broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for conducting the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
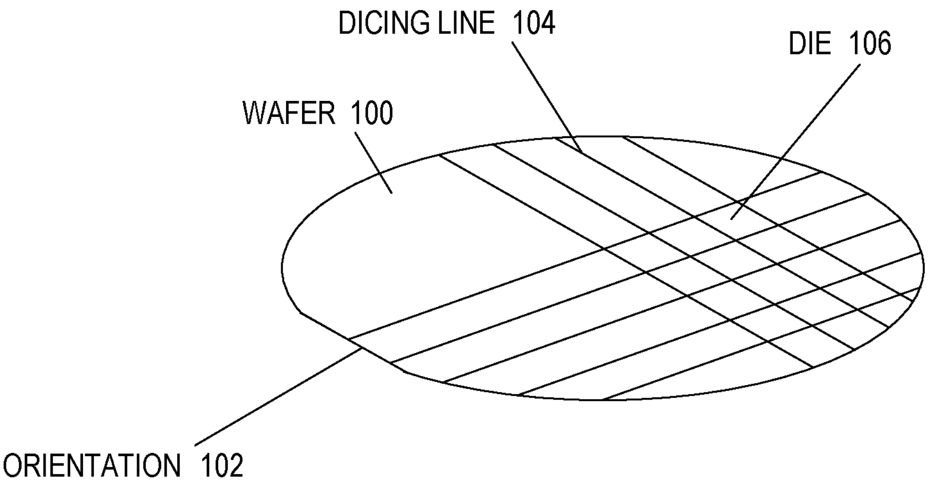
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

As integrated circuit (IC) technology advances, device geometries are reduced. Technological advances in IC materials and design have produced generations of ICs in which each generation has smaller and more complex circuits than the previous generation. In the course of IC evolution, functional density has increased while geometry size has decreased. This scaling down process provides benefits by increasing production efficiency and lowering associated costs. Such scaling down has also increased the complexity of processing and manufacturing ICs. Realizing these advancements involves similar developments in IC processing and manufacturing.

Fin-based devices represent a significant advancement in IC technology over planar-based devices. Fin-based devices are three-dimensional structures on the surface of a semiconductor substrate. A fin field effect transistor (FinFET) is a fin-based metal oxide semiconductor field effect transistor (MOSFET). A nanowire field effect transistor (FET) also represents a significant advancement in IC technology. A gate all around (GAA) nanosheet-based device is another three-dimensional structure on the surface of a semiconductor substrate. Other fin-based devices include omega-gate devices as well as pi-gate devices. A vertical structure-based field effect transistor may be referred to as a FinFET device, a GAA nanosheet-based device, a GAA nanowire-based device, or other like FET device.

Although existing methods of fabricating IC devices are adequate for their intended purposes, they are not entirely satisfactory in all respects. Advanced logic complementary metal oxide semiconductor (CMOS) scaling for FinFET technologies, such as gate all around (GAA) FETs achieves a performance-power-area (PPA) boost over past process nodes. Further FinFET transistor mobility in smaller process nodes, however, is difficult due to channel induced sub-threshold leakage. One solution to channel induced sub-threshold leakage is dielectric junction isolation. Unfortunately, dielectric junction isolation prevents utilization of a vertical P-N junction diode (without introducing extra masking steps). Therefore, a diode structure for a direct backside contact, backside power delivery network (BSPDN) is desired.

Various aspects of the present disclosure are directed to a diode structure for a direct backside contact, backside power delivery network (BSPDN). The process flow for fabricating the diode structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms "wafer" and "die" may be used interchangeably unless such interchanging would tax credulity.

According to various aspects of the present disclosure, a diode structure for a direct backside contact, backside power delivery network (BSPDN) is described. The diode structure includes a nanosheet structure on a substrate, including a first, first-type diffusion region on the substrate and a second, first-type diffusion region on the substrate. Additionally, a first, second-type diffusion region and a second, second-type diffusion region are on the substrate. The diode structure further includes a first gate on the nanosheet structure between the first and second, first-type diffusion regions. In various aspects of the present disclosure, the diode structure includes a first frontside zero (M0) metal layer coupled to a frontside of the first and second, first-type diffusion regions, and a first backside M0 metal layer coupled to a backside of the first and second, first-type diffusion regions to form an anode of the diode structure. Additionally, the diode structure includes a second frontside M0 metal layer coupled to a frontside of the first and second, second-type diffusion regions, and a second backside M0 metal layer coupled to a backside of the first and second, second-type diffusion regions to form a cathode of the diode structure.

FIG. 1 illustrates a perspective view of a semiconductor wafer, which may be used for fabricating a diode structure for a direct backside contact, backside power delivery network (BSPDN), according to various aspects of the present disclosure. A wafer 100 may be a semiconductor wafer or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a single material (e.g., silicon (Si), germanium (Ge)) or a compound material, such as gallium arsenide (GaAs), gallium nitride (GaN), or indium phosphide (InP), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, diverse types of electronic devices may be formed in or on the wafer 100.

The wafer 100 has an orientation 102 that indicates the crystalline orientation of the wafer 100. The orientation 102 may be a flat edge of the wafer 100 as shown in FIG. 1 or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) on the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
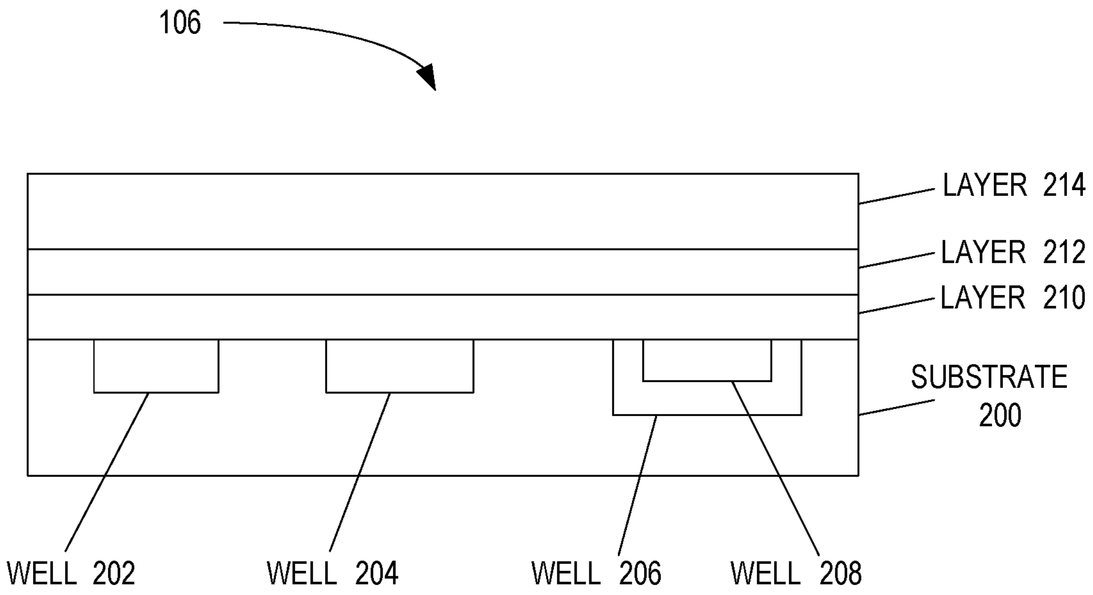
FIG. 2 illustrates a cross-sectional view of the die of FIG. 1.

FIG. 2 illustrates a cross-sectional view of the die 106 of FIG. 1, which may be used for fabricating a diode structure for a direct backside contact, backside power delivery network (BSPDN), according to various aspects of the present disclosure. In the die 106, there may be a substrate 200, which may be a semiconductor material and/or may function as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within the substrate 200 (e.g., a semiconductor substrate), there may be wells 202 and 204 of a field effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
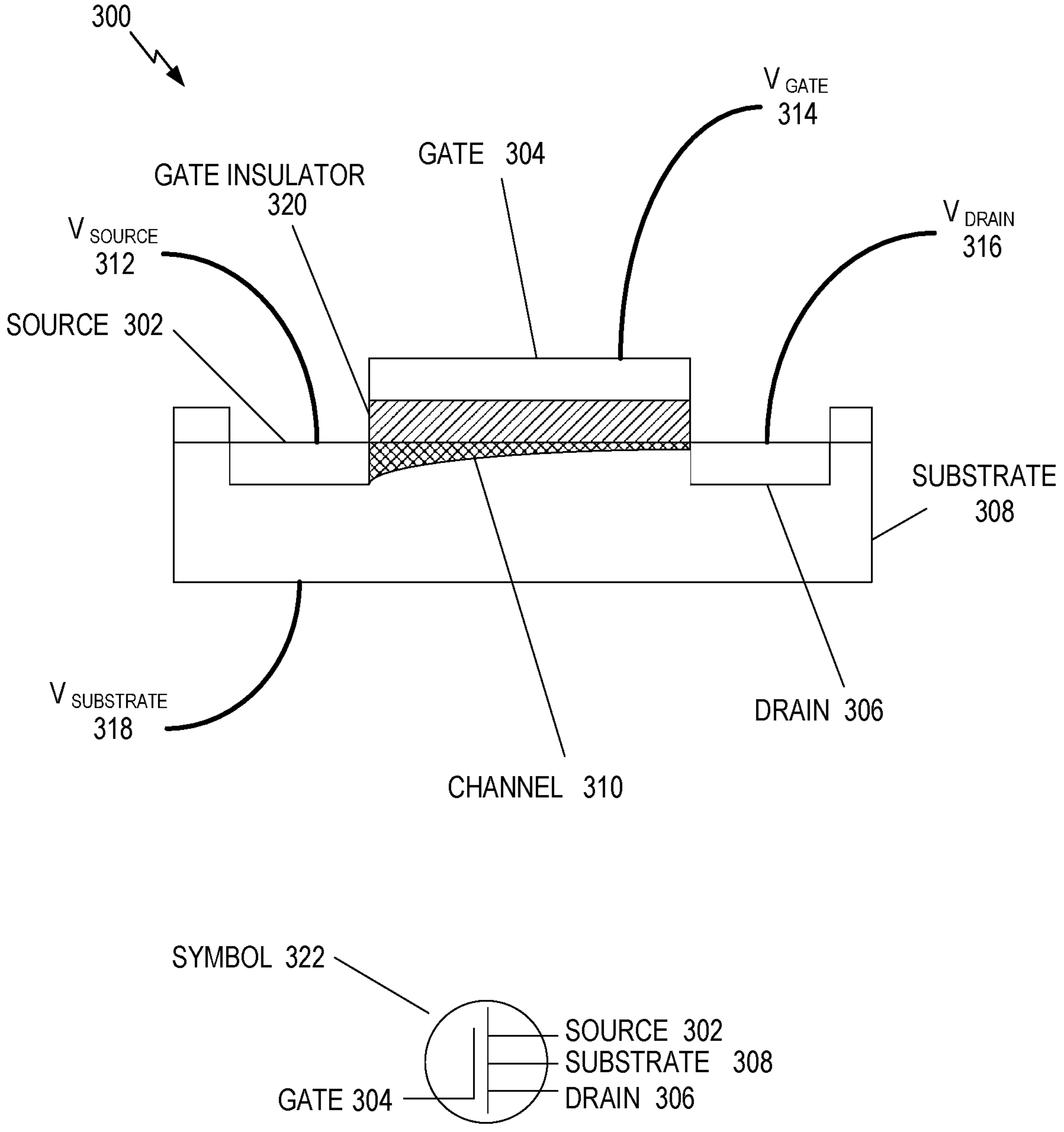
FIG. 3 illustrates a cross-sectional view of a metal oxide semiconductor field effect transistor (MOSFET) device.

FIG. 3 illustrates a cross-sectional view of a metal oxide semiconductor field effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308 or may be fabricated as areas above the substrate 308, or as part of other layers on the die 106. Such other structures may be a fin or other structure that protrudes from a surface of the substrate 308. Further, the substrate 308 may be the substrate 200 on the die 106, but the substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314, or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For P-type MOSFETs (using holes as charge carriers in the channel 310), an arrow is applied to the substrate 308 terminal in the symbol 322 pointing toward the gate 304 terminal.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304, as described below.

To interconnect to the MOSFET device 300, or to interconnect to other devices in the die 106 (e.g., semiconductor), interconnect traces or layers are used. These interconnect traces may be in one or more layers (e.g., 210-214), or may be in other layers of the die 106.

Figure 4:
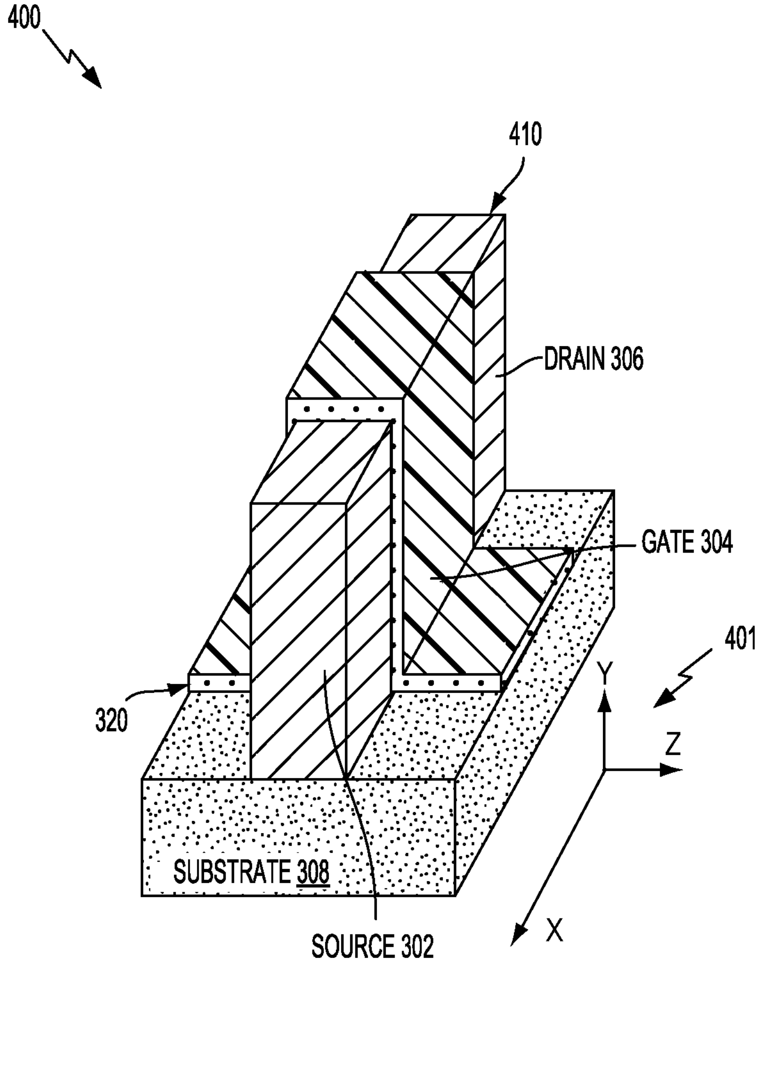
FIG. 4 illustrates a fin-based field effect transistor (FinFET), having a low-k oxide in a gate region, according to various aspects of the present disclosure.

FIG. 4 illustrates a fin-based field effect transistor (FinFET), having a low-k oxide in a gate region, according to various aspects of the present disclosure. As shown in FIG. 4, a FinFET 400 operates in a similar fashion to the MOSFET device 300 described with respect to FIG. 3. A fin 410 of the FinFET 400, however, is grown or otherwise coupled to the substrate 308 of FIG. 3. The substrate 308 may be a semiconductor substrate or other like supporting layer, for example, comprised of an oxide layer, a nitride layer, a metal oxide layer, or a silicon layer. The fin 410 includes the source 302 and the drain 306. A gate 304 is disposed on the fin 410 and on the substrate 308 through a gate insulator 320. An XYZ axis 401 of the FinFET 400 is also shown.

Figure 5:
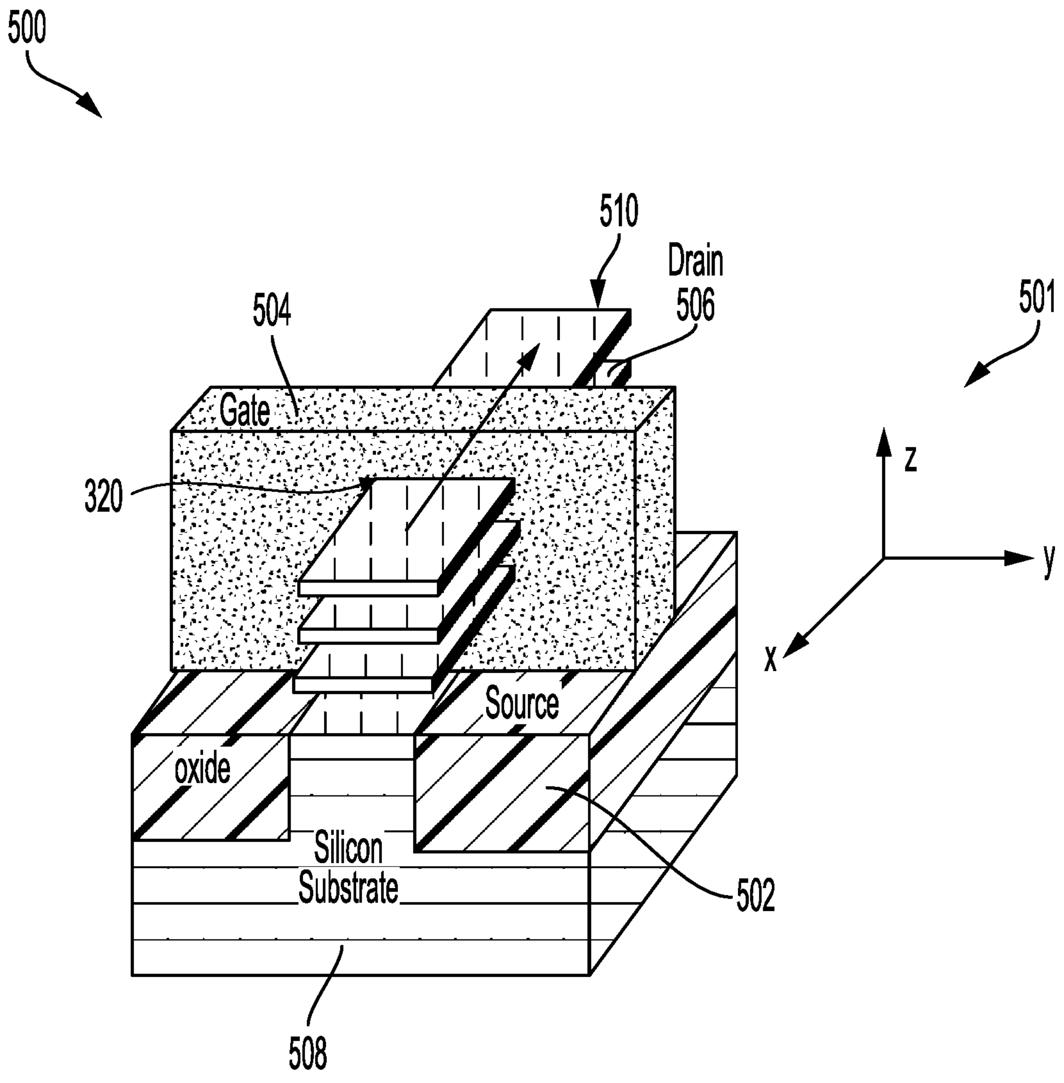
FIG. 5 illustrates a gate all around (GAA) field effect transistor (FET), having a low-k oxide in a gate region, according to various aspects of the present disclosure.

FIG. 5 illustrates a gate all around (GAA) field effect transistor (FET), having a low-k oxide in a gate region, according to aspects of the present disclosure. As shown in FIG. 5, a nanosheet 510 of the GAA FET 500 is grown or otherwise coupled to a substrate 508. The substrate 508 may be a semiconductor substrate or other like supporting layer, for example, comprised of an oxide layer, a nitride layer, a metal oxide layer, or a silicon layer. The nanosheet 510 also includes a source 502 and a drain 506. Additionally, a gate 504 is disposed on and surrounds the nanosheet 460 on four sides through a gate insulator 320 to provide first and second channels. The gate 504 is also on the substrate 508. An XYZ axis 501 of the GAA FET 500 is also shown. As illustrated by the XYZ axis 501, the Y and Z axis are swapped in the configuration of the GAA FET 500 relative to the XYZ axis 401 of the FinFET 400 in FIG. 4.

FIGS. 4 and 5 illustrate vertical structure-based field effect transistors (FETs). The vertical structure of the FinFET 400 and the GAA FET 500 facilitates a physical size of the FinFET 400 and the GAA FET 500 that is smaller than the MOSFET device 300 structure shown in FIG. 3. This reduction in the physical size allows for more devices per unit area on the die 106 shown in FIG. 1. The FinFET 400 and the GAA FET 500 may be fabricated through processes including a front-end-of-line (FEOL), a middle-of-line (MOL) and a back-end-of-line (BEOL). An MOL process includes gate and terminal contact formation, which may be referred to as a zero interconnect (M0) metal layer. An MOL layer trench contacts the source and drain regions of the FinFET 400, and the GAA FET 500 are referred to as metal-to-diffusion (MD) contacts, including metal to diffusion vias (VD) and gate vias (VG).

Vertical structure-based devices, such as the FinFET 400 and the GAA FET 500, represent a significant advancement in integrated circuit (IC) technology over planar-based devices. Vertical structure-based devices are three-dimensional structures on the surface of a semiconductor substrate. A FinFET transistor (e.g., FinFET 400) is a fin-based metal oxide semiconductor field effect transistor (MOSFET). A nanowire FET also represents a significant advancement in IC technology. A gate all around (GAA) nanosheet-based device (e.g., GAA FET 500) is another three-dimensional structure on the surface of a semiconductor substrate. Other vertical structure-based devices include omega-gate devices as well as pi-gate devices. A vertical structure-based field effect transistor may be referred to as a FinFET device, a GAA nanosheet-based device, a GAA nanowire-based device, an omega-gate device, a pi-gate device, or other like FET device.

Although existing methods of fabricating IC devices are adequate for their intended purposes, they are not entirely satisfactory in all respects. Advanced logic complementary metal oxide semiconductor (CMOS) scaling for FinFET technologies, such as gate all around (GAA) FETs achieves a performance-power-area (PPA) boost over past process nodes. Further FinFET transistor mobility in smaller process nodes, however, is difficult due to channel induced sub-threshold leakage. One solution to channel induced sub-threshold leakage is dielectric junction isolation. Unfortunately, dielectric junction isolation prevents utilization of a vertical P-N junction diode (without introducing extra masking steps). Therefore, a diode structure for a direct backside contact, backside power delivery network (BSPDN) is desired. According to various aspects of the present disclosure, a diode structure for a direct backside contact, backside power delivery network (BSPDN) is described, for example, as shown in FIGS. 6A and 6B.

Figures 6A, 6B:
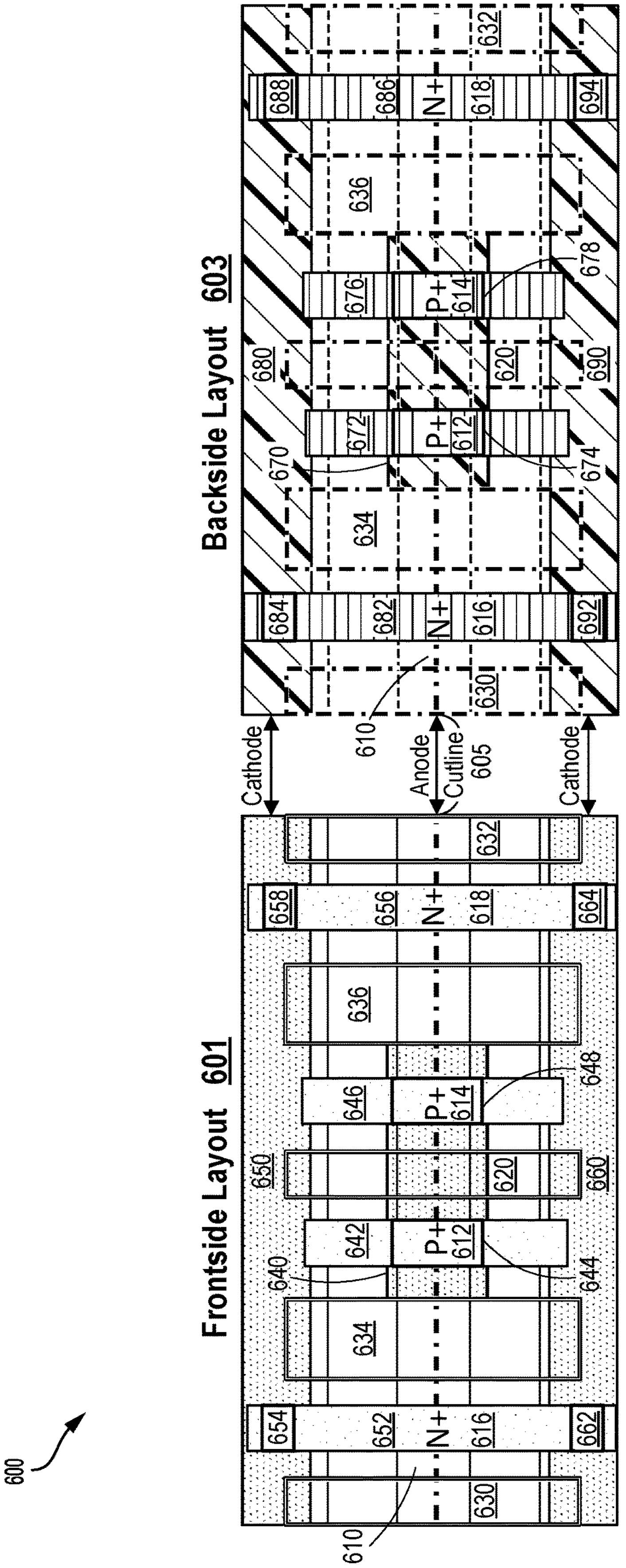
FIGS. 6A and 6B are schematic diagrams illustrating a frontside and a backside layout of a diode structure for a direct backside contact, backside power delivery network (BSPDN), according to various aspects of the present disclosure.

FIGS. 6A and 6B are schematic diagrams illustrating a frontside and a backside layout of a diode structure for a direct backside contact, backside power delivery network (BSPDN), according to various aspects of the present disclosure. As shown in FIG. 6A, a frontside layout 601 of a diode structure 600 includes a nanosheet structure 610 on a substrate (not shown), including a first, first-type diffusion region 612 (e.g., P+) on the substrate and a second, first-type diffusion region 614 (e.g., P+) on the substrate. Additionally, a first, second-type diffusion region 616 (e.g., N+) and a second, second-type diffusion region 618 (e.g., N+) are on the substrate. The diode structure 600 further includes a first gate 620 on the nanosheet structure 610 between the first and second, first-type diffusion regions 612, 614. Additionally, the diode structure 600 includes a second gate 630 on the nanosheet structure 610, proximate the first, second-type diffusion region 616, and a third gate 632 on the nanosheet structure 610, proximate the second, second-type diffusion region 618. Dummy gates 634 and 636 are also shown.

In various aspects of the present disclosure, the diode structure 600 includes a first frontside zero (M0) metal layer 640 coupled to a frontside of the first and second, first-type diffusion regions 612, 614 to provide a frontside anode of the diode structure 600. In this example, the diode structure 600 includes a second frontside M0 metal layer 650 coupled to a frontside of the first and second, second-type diffusion regions 616, 618. Additionally, a third frontside M0 metal layer 660 is coupled to the frontside of the first and second, second-type diffusion regions 616, 618 to form a frontside cathode of the diode structure 600 from the second frontside M0 metal layer 650 and the third frontside M0 metal layer 660.

As shown in FIG. 6A, the first frontside M0 metal layer 640 is coupled to the frontside of the first, first-type diffusion region 612 through a metal-to-diffusion (MD) contact 642 (e.g., a first metal-to-diffusion (MD) contact) and a zero (V0) via 644. Similarly, the first frontside M0 metal layer 640 is coupled to the frontside of the second, first-type diffusion region 614 through an MD contact 646 and a V0 via 648. Additionally, the second frontside M0 metal layer 650 is coupled to the frontside of the first, second-type diffusion region 616 through an MD contact 652 and a V0 via 654, and the second, second-type diffusion region 618 through an MD contact 656 and a V0 via 658. Similarly, the third frontside M0 metal layer 660 is coupled to the frontside of the first, second-type diffusion region 616 through the MD contact 652 and a V0 via 662, and the second, second-type diffusion region 618 through the MD contact 656 and a V0 via 664.

As shown in FIG. 6B, a backside layout 603 of the diode structure 600 illustrates a backside of the nanosheet structure 610, including the first, first-type diffusion region 612 and the second, first-type diffusion region 614, as well as the first, second-type diffusion region 616 and the second, second-type diffusion region 618. FIG. 6B further illustrates a backside of the first gate 620, the second gate 630, and the third gate 632. Additionally, a backside of the dummy gates 634 and 636 between the first and second-type diffusion regions (e.g., 612, 614, 616, 618) is shown in FIG. 6B.

In various aspects of the present disclosure, the diode structure 600 includes a first backside zero M0 metal layer 670 coupled to the backside of the first and second, first-type diffusion regions 612, 614 to provide a backside anode of the diode structure 600. In this example, the diode structure 600 includes a second backside M0 metal layer 680 coupled to a backside of the first and second, second-type diffusion regions 616, 618. Additionally, a third backside M0 metal layer 690 is coupled to the backside of the first and second, second-type diffusion regions 616, 618 to form a backside cathode of the diode structure 600 from the second backside M0 metal layer 680 and the third backside M0 metal layer 690. In various aspects of the present disclosure, the diode is configured as a backside power delivery network (BSPDN) coupled to the backside anode and the backside cathode.

As shown in FIG. 6B, the first backside M0 metal layer 670 is coupled to the frontside of the first, first-type diffusion region 612 through an MD contact 672 (e.g., a first backside MD contact) and a V0 via 674 (e.g., a first backside zero (V0) via). Similarly, the first backside M0 metal layer 670 is coupled to the backside of the second, first-type diffusion region 614 through an MD contact 676 (e.g., a second backside MD contact) and a V0 via 678 (e.g., a second backside V0 via). Additionally, the second backside M0 metal layer 680 is coupled to the backside of the first, second-type diffusion region 616 through an MD contact 682 and a V0 via 684, and the second, second-type diffusion region 618 through an MD contact 686 and a V0 via 688. Similarly, the third frontside M0 metal layer 690 is coupled to the backside of the first, second-type diffusion region 616 through the MD contact 682 and a V0 via 692, and the second, second-type diffusion region 618 through the MD contact 686 and a V0 via 694.

In various aspects of the present disclosure, the first and second, first-type diffusion regions 612, 614 may be composed of silicon (Si), embedded silicon (eSi), germanium (Ge), gallium arsenide (GaAs), indium GaAs (InGaAs), gallium nitride (GaN), graphene, molybdenum disulfide ($MoS_2$), and/or phosphorus. Additionally, the first and second, first-type diffusion regions 616, 618 may be composed of silicon (Si), germanium (Ge), embedded silicon germanium (eSiGe), silicon germanium (SiGe), indium antimonide (InSb), graphene, molybdenum disulfide ($MoS_2$), and/or phosphorus. A cross-sectional view of the diode structure 600 along a cutline 605 is illustrated, for example, in FIG. 7.

Figure 7:
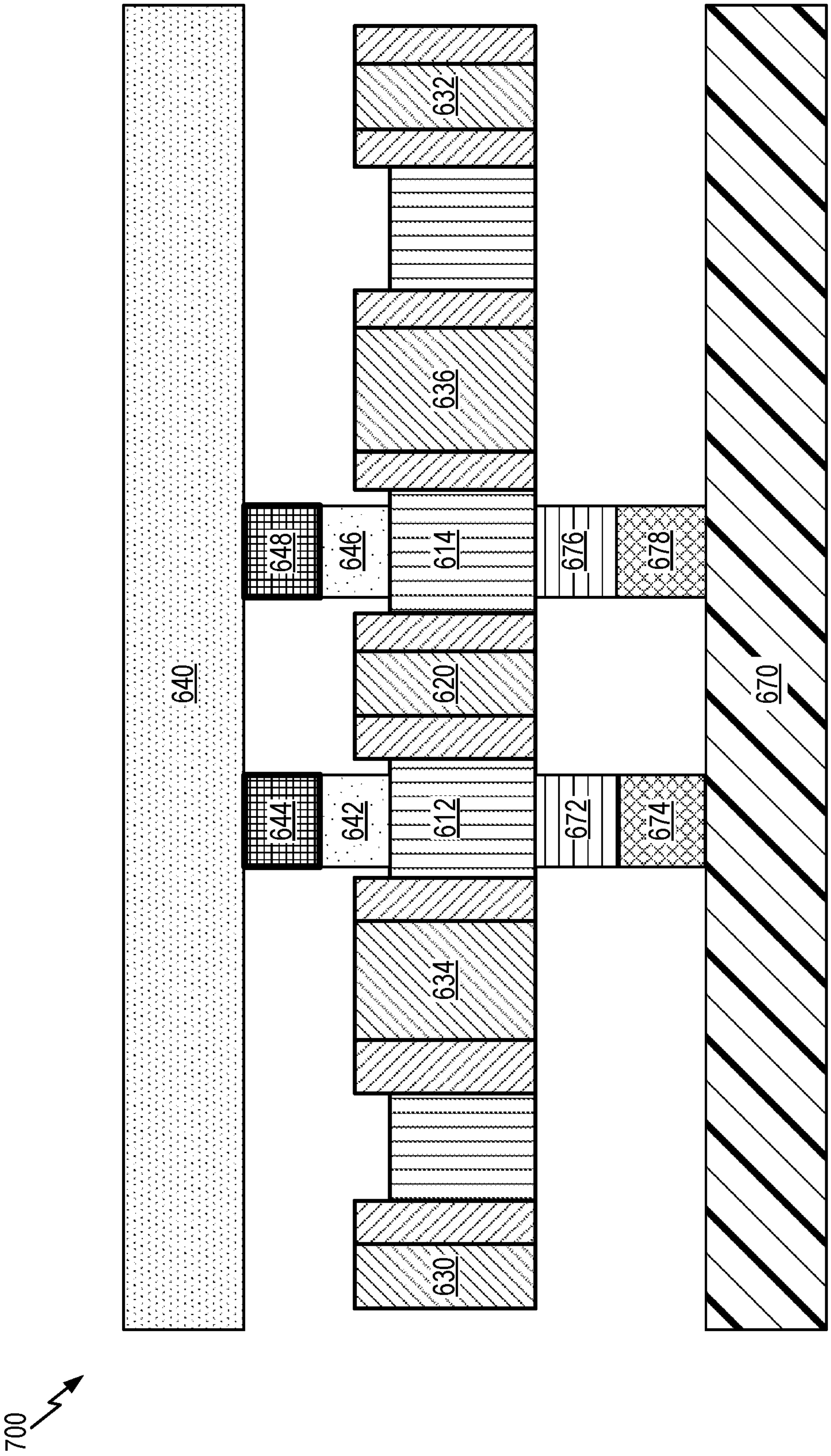
FIG. 7 is a schematic diagram illustrating a cross-sectional view of the diode structure for a direct backside contact, backside power delivery network (BSPDN) of FIGS. 6A and 6B, according to various aspects of the present disclosure.

FIG. 7 is a schematic diagram illustrating a cross-sectional view 700 of the diode structure 600 for a direct backside contact, backside power delivery network (BSPDN) of FIGS. 6A and 6B, according to various aspects of the present disclosure. As shown in FIG. 7, the cross-sectional view 700 illustrates the first frontside zero (M0) metal layer 640 coupled to the frontside of the first and second, first-type diffusion regions 612, 614 to provide a frontside anode of the diode structure 600. Additionally, the first backside zero M0 metal layer 670 is coupled to the backside of the first and second, first-type diffusion regions 612, 614 to provide a backside anode of the diode structure 600.

As shown in FIG. 7, the first frontside M0 metal layer 640 is coupled to the frontside of the first, first-type diffusion region 612 through the MD contact 642 and the V0 via 644. Similarly, the first frontside M0 metal layer 640 is coupled to the frontside of the second, first-type diffusion region 614 through the MD contact 646 and the V0 via 648. The cross-sectional view further illustrates the first backside M0 metal layer 670 coupled to the backside of the first, first-type diffusion region 612 through the MD contact 672 and the V0 via 674. Additionally, the first backside M0 metal layer 670 is coupled to the backside of the second, first-type diffusion region 614 through the MD contact 676 and the V0 via 678. In various aspects of the present disclosure, the diode structure 600 may be configured as an electro-static detection (ESD) device.

Figure 8:
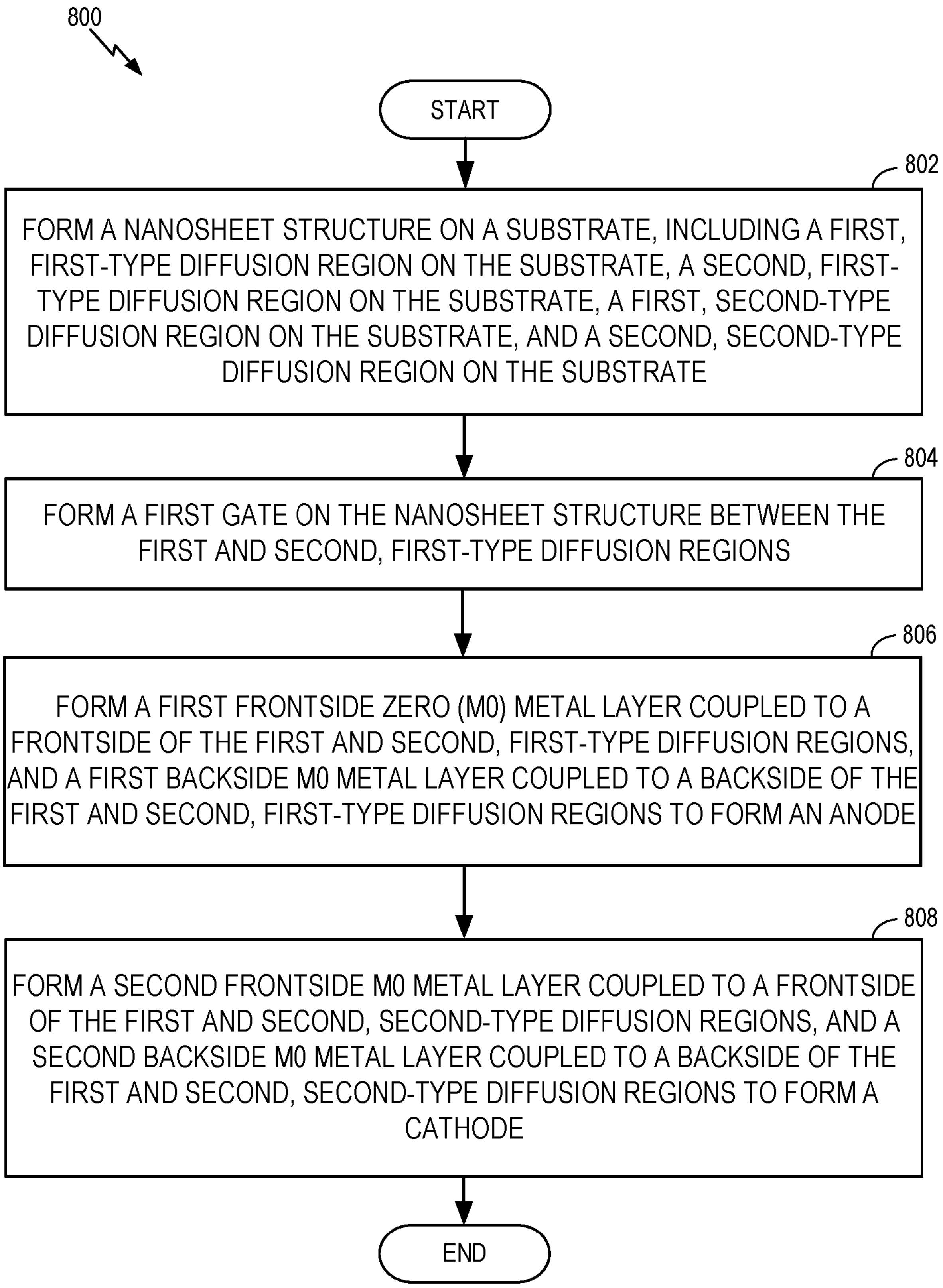
FIG. 8 is a process flow diagram illustrating a method for fabricating a diode structure for a direct backside contact, backside power delivery network (BSPDN), according to various aspects of the present disclosure.

FIG. 8 is a process flow diagram illustrating a method 800 for fabricating a diode structure for a direct backside contact, backside power delivery network (BSPDN), according to various aspects of the present disclosure. The method 800 begins at block 802, in which a nanosheet structure is formed on a substrate. The nanosheet structure including a first, first-type diffusion region on the substrate, a second, first-type diffusion region on the substrate, a first, second-type diffusion region on the substrate, and a second, second-type diffusion region on the substrate. For example, FIG. 6A shows the frontside layout 601 of the diode structure 600, including a nanosheet structure 610 on a substrate (not shown), having a first, first-type diffusion region 612 (e.g., P+) on the substrate and a second, first-type diffusion region 614 (e.g., P+) on the substrate. Additionally, a first, second-type diffusion region 616 (e.g., N+) and a second, second-type diffusion region 618 (e.g., N+) are on the substrate.

At block 804, a first gate is formed on the nanosheet structure between the first and second, first-type diffusion regions. For example, as shown FIG. 6A, the diode structure 600 further includes a first gate 620 on the nanosheet structure 610 between the first and second, first-type diffusion regions 612, 614.

At block 806, a first frontside zero (M0) metal layer is formed and coupled to a frontside of the first and second, first-type diffusion regions, and a first backside M0 metal layer is formed and coupled to a backside of the first and second, first-type diffusion regions to form an anode. For example, as shown in FIG. 6A, the first frontside M0 metal layer 640 is coupled to the frontside of the first, first-type diffusion region 612 through a metal-to-diffusion (MD) contact 642 (e.g., a first metal-to-diffusion (MD) contact) and a zero (V0) via 644. Additionally, as shown in FIG. 6B, the diode structure 600 includes a first backside zero M0 metal layer 670 coupled to the backside of the first and second, first-type diffusion regions 612, 614 to provide a backside anode of the diode structure 600.

At block 808, a second frontside M0 metal layer is formed and coupled to a frontside of the first and second, second-type diffusion regions, and a second backside M0 metal layer is formed and coupled to a backside of the first and second, second-type diffusion regions to form a cathode. For example, as shown in FIG. 6B, the diode structure 600 includes a second frontside M0 metal layer 650 coupled to a frontside of the first and second, second-type diffusion regions 616, 618. Additionally, a third frontside M0 metal layer 660 is coupled to the frontside of the first and second, second-type diffusion regions 616, 618 to form a frontside cathode of the diode structure 600 from the second frontside M0 metal layer 650 and the third frontside M0 metal layer 660.

Figure 9:
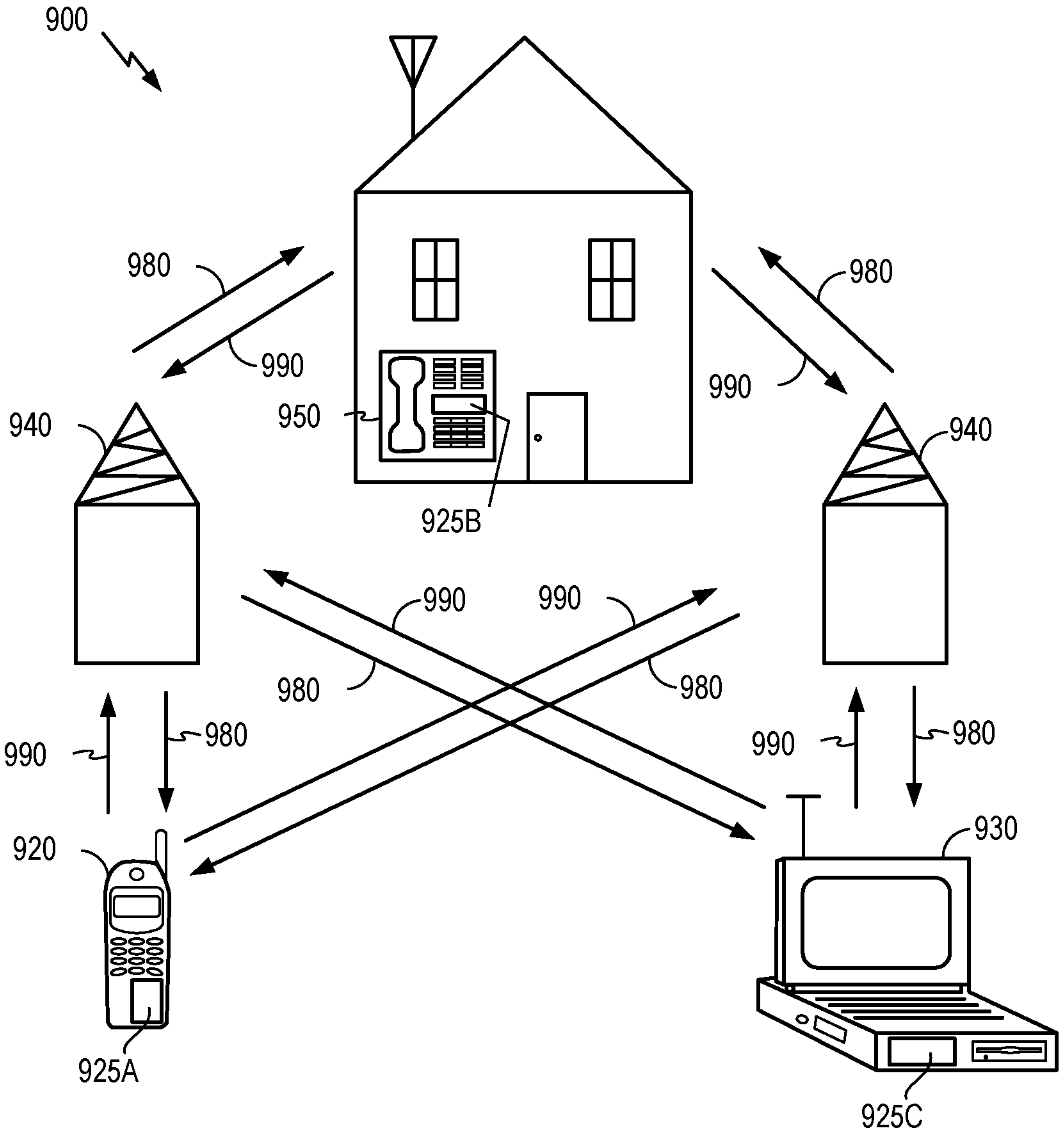
FIG. 9 is a block diagram showing an exemplary wireless communications system in which an aspect of the disclosure may be advantageously employed.

FIG. 9 is a block diagram showing an exemplary wireless communications system 900 in which an aspect of the disclosure may be advantageously employed. For purposes of illustration, FIG. 9 shows three remote units 920, 930, and 950, and two base stations 940. It will be recognized that wireless communications systems may have many more remote units and base stations. Remote units 920, 930, and 950 include IC devices 925A, 925C, and 925B that include the disclosed diode structure for a direct backside contact, backside power delivery network (BSPDN). It will be recognized that other devices may also include the disclosed diode structure for a direct backside contact, BSPDN, such as the base stations, switching devices, and network equipment. FIG. 9 shows forward link signals 980 from the base station 940 to the remote units 920, 930, and 950, and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed diode structure for a direct backside contact, BSPDN.

Figure 10:
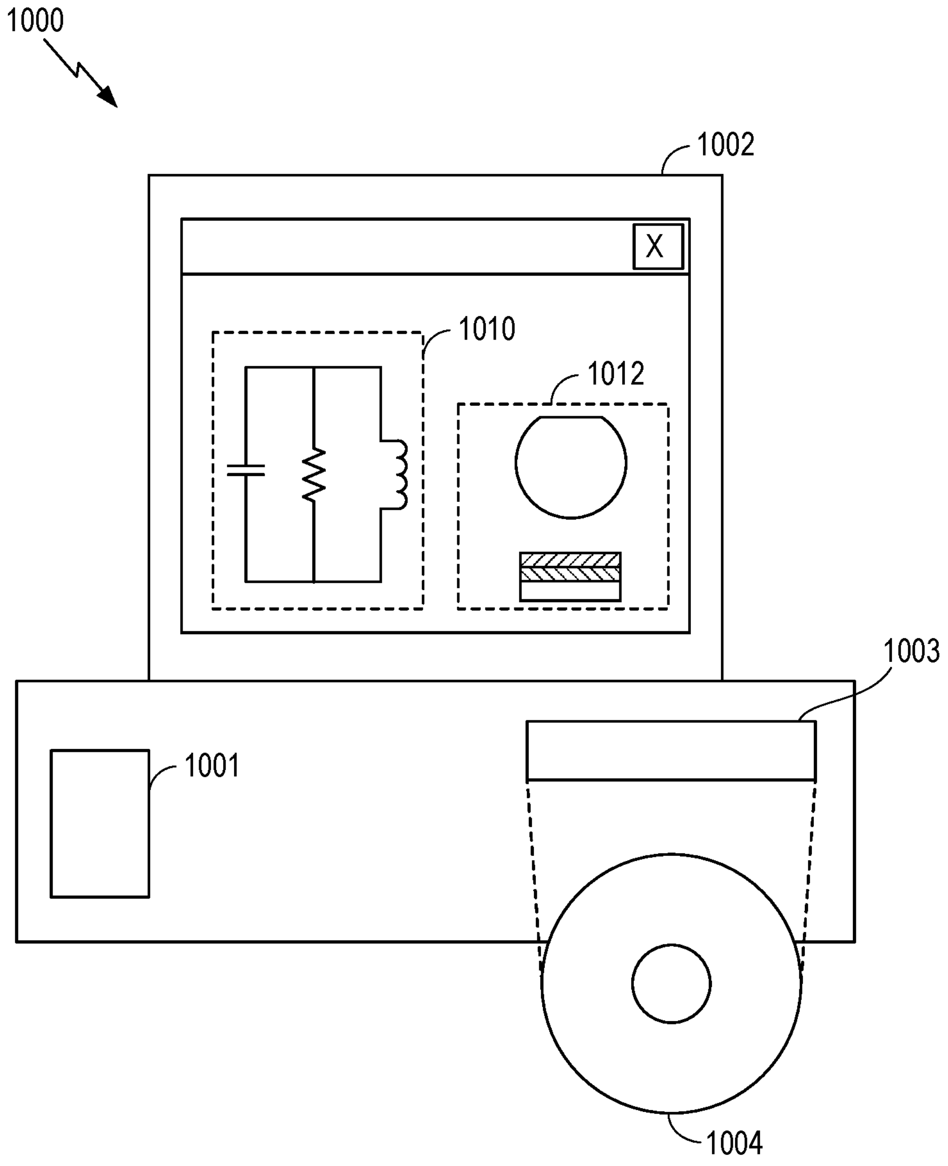
FIG. 10 is a block diagram illustrating a design workstation used for circuit, layout, and logic design of a transistor structure according to one configuration.

FIG. 10 is a block diagram illustrating a design workstation used for circuit, layout, and logic design of an IC structure, such as the diode structure disclosed above. A design workstation 1000 includes a hard disk 1001 containing operating system software, support files, and design software such as Cadence or OrCAD. The design workstation 1000 also includes a display 1002 to facilitate design of a circuit 1010 or a nanosheet structure 1012 including a GAA FET. A storage medium 1004 is provided for tangibly storing the design of the circuit 1010 or the nanosheet structure 1012. The design of the circuit 1010 or the nanosheet structure 1012 may be stored on the storage medium 1004 in a file format such as GDSII or GERBER. The storage medium 1004 may be a CD-ROM, DVD, hard disk, flash memory, or other appropriate device. Further-more, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the nanosheet structure 1012 by decreasing the number of processes for designing semiconductor wafers.

Implementation examples are described in the following numbered clauses:

1. A diode structure, comprising:
   - a nanosheet structure on a substrate, including a first, first-type diffusion region on the substrate, a second, first-type diffusion region on the substrate, a first, second-type diffusion region on the substrate, and a second, second-type diffusion region on the substrate;
   - a first gate on the nanosheet structure between the first and second, first-type diffusion regions;
   - a first frontside zero (M0) metal layer coupled to a frontside of the first and second, first-type diffusion regions, and a first backside M0 metal layer coupled to a backside of the first and second, first-type diffusion regions to form an anode; and a second frontside M0 metal layer coupled to a frontside of the first and second, second-type diffusion regions, and a second backside M0 metal layer coupled to a backside of the first and second, second-type diffusion regions to form a cathode.
2. The diode structure of clause 1, in which the first gate horizontally surrounds the nanosheet structure on four sides.
3. The diode structure of any of clauses 1 or 2, in which the first-type diffusion region comprises a P+ diffusion region and the second-type diffusion region comprises an N+ diffusion region.
4. The diode structure of any of clauses 1-3, further comprising:
   - a first metal-to-diffusion (MD) contact coupled to a frontside of the first, first-type diffusion regions;
   - a first zero (V0) via coupled to the first MD contact;
   - a second MD contact coupled to a frontside of the first and second, first-type diffusion regions; and
   - a second V0 via coupled to the second MD contact.
5. The diode structure of clause 4, in which the first frontside M0 metal layer is coupled to the first V0 via and the second V0 via.
6. The diode structure of any of clauses 1-5, further comprising:
   - a first backside MD contact coupled to a backside of the first, first-type diffusion region;
   - a first backside zero (V0) via coupled to the first backside MD contact;
   - a second backside MD contact coupled to a backside of the second, first-type diffusion region; and
   - a second backside V0 via coupled to the second backside MD contact.
7. The diode structure of clause 6, in which the first backside M0 metal layer is coupled to the first backside V0 via and the second backside V0 via.
8. The diode structure of any of clauses 1-7, further comprising:
   - a third frontside M0 metal layer coupled to the frontside of the first and second, second-type diffusion regions opposite the second frontside M0 metal layer; and
   - a third backside M0 metal layer coupled to the backside of the first and second, second-type diffusion regions, opposite the second backside M0 metal layer to form the cathode.
9. The diode structure of any of clauses 1-8, further comprising a backside power delivery network (BSPDN) coupled to the anode and the cathode.
10. The diode structure of any of clauses 1-8, in which the diode structure comprises an electro-static detection (ESD) device.
11. A method of forming a diode structure, the method comprising:
    - forming a nanosheet structure on a substrate, including a first, first-type diffusion region on the substrate, a second, first-type diffusion region on the substrate, a first, second-type diffusion region on the substrate, and a second, second-type diffusion region on the substrate;
    - forming a first gate on the nanosheet structure between the first and second, first-type diffusion regions;
    - forming a first frontside zero (M0) metal layer coupled to a frontside of the first and second, first-type diffusion regions, and a first backside M0 metal layer coupled to a backside of the first and second, first-type diffusion regions to form an anode; and
    - forming a second frontside M0 metal layer coupled to a frontside of the first and second, second-type diffusion regions, and a second backside M0 metal layer coupled to a backside of the first and second, second-type diffusion regions to form a cathode.
12. The method of clause 11, in which the first gate horizontally surrounds the nanosheet structure on four sides.
13. The method of any of clauses 11 or 12, in which the first-type diffusion region comprises a P+ diffusion region and the second-type diffusion region comprises an N+ diffusion region.
14. The method of any of clauses 11-13, further comprising:
    - forming a first metal-to-diffusion (MD) contact coupled to a frontside of the first, first-type diffusion regions;
    - forming a first zero (V0) via coupled to the first MD contact;
    - forming a second MD contact coupled to a frontside of the first and second, first-type diffusion regions; and
    - forming a second V0 via coupled to the second MD contact.
15. The method of clause 14, in which the first frontside M0 metal layer is coupled to the first V0 via and the second V0 via.
16. The method of any of clauses 11-15, further comprising:
    - forming a first backside MD contact coupled to a backside of the first, first-type diffusion region;
    - forming a first backside zero (V0) via coupled to the first backside MD contact;
    - forming a second backside MD contact coupled to a backside of the second, first-type diffusion region; and
    - forming a second backside V0 via coupled to the second backside MD contact.
17. The method of clause 16, in which the first backside M0 metal layer is coupled to the first backside V0 via and the second backside V0 via.
18. The method of any of clauses 11-17, further comprising:
    - forming a third frontside M0 metal layer coupled to the frontside of the first and second, second-type diffusion regions opposite the second frontside M0 metal layer; and forming a third backside M0 metal layer coupled to the backside of the first and second, second-type diffusion regions, opposite the second backside M0 metal layer to form the cathode.

19. The method of any of clauses 11-18, further comprising forming a backside power delivery network (BSPDN) coupled to the anode and the cathode.

20. The method of any of clauses 11-18, in which the diode structure comprises an electro-static detection (ESD) device.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A diode structure, comprising:

a nanosheet structure on a substrate, including a first, first-type diffusion region on the substrate, a second, first-type diffusion region on the substrate, a first, second-type diffusion region on the substrate, and a second, second-type diffusion region on the substrate;

a first gate on the nanosheet structure between the first and second, first-type diffusion regions;

a first frontside zero (M0) metal layer coupled to a frontside of the first and second, first-type diffusion regions, and a first backside M0 metal layer coupled to a backside of the first and second, first-type diffusion regions to form an anode; and a second frontside M0 metal layer coupled to a frontside of the first and second, second-type diffusion regions, and a second backside M0 metal layer coupled to a backside of the first and second, second-type diffusion regions to form a cathode.

2. The diode structure of claim 1, in which the first gate horizontally surrounds the nanosheet structure on four sides.

3. The diode structure of claim 1, in which the first-type diffusion region comprises a P+ diffusion region and the second-type diffusion region comprises an N+ diffusion region.

4. The diode structure of claim 1, further comprising:

a first metal-to-diffusion (MD) contact coupled to a frontside of the first, first-type diffusion regions;

a first zero (V0) via coupled to the first MD contact;

a second MD contact coupled to a frontside of the first and second, first-type diffusion regions; and a second V0 via coupled to the second MD contact.

5. The diode structure of claim 4, in which the first frontside M0 metal layer is coupled to the first V0 via and the second V0 via.

6. The diode structure of claim 1, further comprising:

a first backside MD contact coupled to a backside of the first, first-type diffusion region;

a first backside zero (V0) via coupled to the first backside MD contact;

a second backside MD contact coupled to a backside of the second, first-type diffusion region; and a second backside V0 via coupled to the second backside MD contact.

7. The diode structure of claim 6, in which the first backside M0 metal layer is coupled to the first backside V0 via and the second backside V0 via.

8. The diode structure of claim 1, further comprising:

a third frontside M0 metal layer coupled to the frontside of the first and second, second-type diffusion regions opposite the second frontside M0 metal layer; and a third backside M0 metal layer coupled to the backside of the first and second, second-type diffusion regions, opposite the second backside M0 metal layer to form the cathode.

9. The diode structure of claim 1, further comprising a backside power delivery network (BSPDN) coupled to the anode and the cathode.

10. The diode structure of claim 1, in which the diode structure comprises an electro-static detection (ESD) device.

11. A method of forming a diode structure, the method comprising:

forming a nanosheet structure on a substrate, including a first, first-type diffusion region on the substrate, a second, first-type diffusion region on the substrate, a first, second-type diffusion region on the substrate, and a second, second-type diffusion region on the substrate;

forming a first gate on the nanosheet structure between the first and second, first-type diffusion regions;

forming a first frontside zero (M0) metal layer coupled to a frontside of the first and second, first-type diffusion regions, and a first backside M0 metal layer coupled to a backside of the first and second, first-type diffusion regions to form an anode; and forming a second frontside M0 metal layer coupled to a frontside of the first and second, second-type diffusion regions, and a second backside M0 metal layer coupled to a backside of the first and second, second-type diffusion regions to form a cathode.

12. The method of claim 11, in which the first gate horizontally surrounds the nanosheet structure on four sides.

13. The method of claim 11, in which the first-type diffusion region comprises a P+ diffusion region and the second-type diffusion region comprises an N+ diffusion region.

14. The method of claim 11, further comprising:

forming a first metal-to-diffusion (MD) contact coupled to a frontside of the first, first-type diffusion regions;

forming a first zero (V0) via coupled to the first MD contact;

forming a second MD contact coupled to a frontside of the first and second, first-type diffusion regions; and forming a second V0 via coupled to the second MD contact.

15. The method of claim 14, in which the first frontside M0 metal layer is coupled to the first V0 via and the second V0 via.

16. The method of claim 11, further comprising:

forming a first backside MD contact coupled to a backside of the first, first-type diffusion region;

forming a first backside zero (V0) via coupled to the first backside MD contact;

forming a second backside MD contact coupled to a backside of the second, first-type diffusion region; and forming a second backside V0 via coupled to the second backside MD contact.

17. The method of claim 16, in which the first backside M0 metal layer is coupled to the first backside V0 via and the second backside V0 via.

18. The method of claim 11, further comprising:

forming a third frontside M0 metal layer coupled to the frontside of the first and second, second-type diffusion regions opposite the second frontside M0 metal layer; and forming a third backside M0 metal layer coupled to the backside of the first and second, second-type diffusion regions, opposite the second backside M0 metal layer to form the cathode.

19. The method of claim 11, further comprising forming a backside power delivery network (BSPDN) coupled to the anode and the cathode.

20. The method of claim 11, in which the diode structure comprises an electro-static detection (ESD) device.

* * * * *